United States Patent [19]

Denholm et al.

[11] 4,446,373
[45] May 1, 1984

[54] PROCESS AND APPARATUS FOR CONVERGED FINE LINE ELECTRON BEAM TREATMENT OBJECTS

[75] Inventors: A. Stuart Denholm, Lincoln; William A. Frutiger, Beverly; Kenneth E. Williams, Andover, all of Mass.

[73] Assignee: Sony Corporation, Tokyo, Japan

[21] Appl. No.: 455,266

[22] Filed: Jan. 3, 1983

Related U.S. Application Data

[63] Continuation of Ser. No. 224,313, Jan. 12, 1981, Pat. No. 4,382,186.

[51] Int. Cl.³ .............................................. H01J 37/00
[52] U.S. Cl. .................. 250/492.2; 250/400; 219/121 EB; 219/121 EM
[58] Field of Search ............ 250/423 R, 492.2, 492.3, 250/398, 400; 219/121 EB, 121 EM

[56] References Cited

U.S. PATENT DOCUMENTS

| | | | |
|---|---|---|---|
| 2,729,748 | 1/1956 | Robinson | 250/400 |
| 3,144,552 | 8/1964 | Schonberg et al. | 250/400 |
| 3,193,717 | 7/1965 | Nunan | 250/400 |
| 3,614,423 | 10/1971 | Heynick et al. | 250/492.2 |
| 3,780,334 | 12/1973 | Leboutet | 313/299 |
| 4,151,422 | 4/1979 | Goto et al. | 250/492.2 |
| 4,258,266 | 3/1981 | Robinson et al. | 250/492.2 |
| 4,301,369 | 11/1981 | Mutsuo et al. | 250/423 R |

FOREIGN PATENT DOCUMENTS 1032071  6/1966  United Kingdom .

*Primary Examiner*—Bruce C. Anderson
*Attorney, Agent, or Firm*—Lewis H. Eslinger; Alvin Sinderbrand

[57] ABSTRACT

This disclosure is concerned with the use of fine line converged electron beams of high aspect ratio for effecting physical, chemical, mechanical and other changes in the surface of objects, and also volume effects, including applications, for example, to semiconductor and other materials surface modification technology, annealing, welding, etching, polishing, cutting, curing and other surface and volume alteration.

34 Claims, 7 Drawing Figures

PROCESS AND APPARATUS FOR CONVERGED FINE LINE ELECTRON BEAM TREATMENT OBJECTS

This is a continuation, of application Ser. No. 06/224,313, filed Jan. 12, 1981, now U.S. Pat. No. 4,382,186.

The present invention relates to electron beam irradiation processes and apparatus, being more particularly directed to novel processes and apparatus for producing a unique fine line strip electron beam of high aspect ratio and employing the same for effecting treatment of physical, chemical, mechanical and other properties in the surfaces of objects, and in some instances in the volume thereof. In this specification and the claims, the term electron beam "treatment" is employed generically to embrace the effecting of one or more of physical, chemical, mechanical or other changes in an object being subjected to or treated by the electron beam, whether effected through resulting thermal or charged-particle effects, or primary or secondary shock, radiation, electrical or acoustical or other effects, including but not limited to such treatment effects as annealing and welding, etching, curing, cutting, polishing, and other surface alteration.

An important application of the invention, though by no means restricted thereto, is in fulfilling the various requirements in the semiconductor industry for the use of electron beams for the surface annealing of devices and similar applications. As an example, ion implantation produces superficial crystal damage in the implanted region which has to be annealed out (e.g. by liquid phase or solid phase recrystallization); and, in general, this has been done by bulk heating in an oven. Recently it has been shown that improved devices can be obtained by heating only the damaged surface region. It is also possible to generate single crystal surfaces from amorphous material deposited on a single crystal base through epitaxial growth. To heat only the surface and not the bulk of the material requires that an energy flux of high power density be applied to the crystal surface for a very short time. The surface attains a high temperature before the heat has time to diffuse into the bulk of the material.

Methods of achieving this are with high power photons as from a laser, or by electrons as from spot electron beams. Previously published methods of electron annealing describe either pulsed electron beam systems based on cold (plasma) cathode devices (see, for example, Greenwald, A. C. and Little, R. G., "Pulsed Electron-Beam Processing of Semiconductor Devices", Solid State Technology, April 1979) which treat relatively large areas in a single pulse of electrons, or describe the use of spot beams from modified equipment such as from scanning electron microscopes or electron beam welders (for example, Regolini, J. L., Gibbons, J. F., Sigmon, T. W. and Pease, R. F. W., "Scanning-Electron-Beam Annealing of Arsenic-Implanted Silicon", Appl. Phys. Lett. 34 (6), 15 March 1979, p. 410). Intense, incoherent light generated by high intensity pulsed flash lamps are another planar energy source considered for some of the identified applications.

The principal advantage of planar energy beams is that the entire target surface area can be heated to a very high temperature in a few nano-seconds. To do this at an absorbed flux of a few tens of MW's/cm$^2$, requires current densities of several kA/cm$^2$ for electron beam voltages on the order of 10 keV or less. Sources for these high current densities are few and, in fact, for commercial applications, only one type currently seems at all practical; namely, the cold cathode gun. Unfortunately, as the cathode plasma propagates toward the anode of the gun, the current density available from its leading edge increases very rapidly during the treatment pulse, drastically decreasing the electron gun impedance. This causes a corresponding decrease in accelerating potential, leading to objectionable temporal non-uniformity of deposited energy both in the object or material being treated and in the electron beam window (if external beams are used). There also is a significant spatial non-uniformity associated with variable emission from individual cathode emission sites which may be randomly distributed depending upon the particular cathode design. Thus, this planar electron beam source is characterized by non-uniform heating caused by spatial and temporal variations of both current density and electron energy. With a large area cathode approach, moreover, it is not possible to restrict contamination flow from the material being treated, and the large cathode produces contamination flux. As for the planar incoherent light sources, such as intense pulsed flash lamps, because of their low efficiency (typically 2%) and because photon absorption is a function of material properties and temperature, these sources also suffer from temporal variations in absorbed energy.

Another disadvantage common to both photon and electron pulsed planar sources is that they are not particularly well suited for the volume heating applications. While the repetitive pulsing of these sources will enable the average power required for volume heating to be achieved, because of the inherently high flux levels characteristic of these sources, the fluence for surface damage can be exceeded during repetitively pulsed operation.

Until the present invention, therefore, spot electron beams and spot laser beams have been the most readily available sources of energy for the identified applications. For this reason, most of the small scale proof-of-principle physics experiments done to date have been performed with one of these sources. The chief disadvantage of each of these sources is that they are limited to small spot sizes typically on the order of a few 10's to a few 100's of microns. For the laser, this constraint is due to its inherently low total output power capability. While the spot diameter of the electron beam is not similarly constrained by output power capability, nor is it penalized by low operating efficiency, the principal disadvantages of the spot electron beam is that the spot diameter is constrained by space charge-induced electron beam blow-up.

A more serious problem with each of the spot photon and electron spot energy beams, however, is the severe spatial non-uniformity associated with small circular energy beams. The non-uniform temperature distribution produced by the spot energy beams leaves the macrosopic processed area resembling a plowed field, even with careful overlapping of successive scans. (See, for example, Lax, M., "Temperature Rise Induced By A Laser Beam", Amer. Inst. Phys., J. App. Phys., 48, No. 9, Sept. 1977).

An even more fundamental disadvantage of spot energy beams is that, owing to thermal diffusion from the nearly point source, they require a higher absorbed flux to reach a given surface temperature than either planar or strip energy beams. The laser source suffers the additional disadvantage of extremely low efficiency, thus making it attractive only for small scale proof-of-principle experiments.

Strip energy beams can be produced in a number of ways. For example, spot photon and spot electron beams can be scanned rapidly in one dimension to form a strip energy beam. The inherent disadvantages of photon energy beams just described, however, are not eliminated by this method. The requirement for the scanned spot electron beam is that it must be scanned over large distances at high frequency while modulating the electron beam optics in such a manner as to maintain a planar focus at the target. The space charge-induced beam blow-up makes this a particularly difficult goal for the required low voltage, high-current density spot electron beam.

A more suitable strip electron beam can be formed by extraction of electrons from a uniformly emitting rectangular cathode of high aspect ratio, with the length of the strip cathode being made comparable to the width of the area to be processed, and the narrow cathode dimension being chosen to be compatible with long-term, uniform cathode emission and the compression of the electon beam, which are both dictated by application requirements. A converged thin line strip beam highly suitable for the purposes of the invention resulted.

In comparison with the spot energy beam, the thin converged strip electron beam offers the important advantages of rapid treatment of small and large areas with a beam characterized by excellent spatial and temporal uniformity of both current density and electron energy.

Another advantage of these novel strip energy beams is that the flux required to heat a material to any given surface temperature is considerably less than for a spot energy beam of uniform flux. At 200 kW/cm$^2$, for example, a spot energy beam 200 microns in diameter will raise the surface at a semi-infinite slab of silicon to its melting temperature in approximately 50 $\mu$sec. This time is reduced to slightly greater than a microsecond by increasing the absorbed flux to 1000 kW/cm$^2$. At 100 kW/cm$^2$, the melting temperature cannot be reached at all; but, rather, of maximum temperature of approximately 1200° C. is obtained in about 100 msec. The flux required using the strip energy beam is much less than that required by the spot energy beam; and for surface heating applications, the flux required by the strip energy beam can be lower by more than an order of magnitude than that required by the spot energy beam. This is of fundamental practical importance for large commercial systems. Though the theoretical concept of a strip electron beam seemed of interest, it was at first entirely contraindicated by the then known requirements for generating such beams and their operational characteristics, as represented by the "Electrocurtain" and "Electropulse" equipments of Energy Sciences Inc., the assignee of the present invention, and as described, for example, in their U.S. Pat. Nos. 3,702,412; 3,745,396; and 3,769,600; and European Patent Office Publication 011414 of patent application 79 302391.2. Such experience, however, initially led away from the practical possibility of considering the use of strip electron beams for the very critical and different requirements underlying the problems to be solved by the present invention. For the before-mentioned semiconductor surface treatment applications, for example, principal requirements are that energy be uniformly deposited in a region within a few microns of the material surface at flux-fluence levels that can raise the surface temperature to very high values without substantially heating the material outside the energy deposition region. This requires electron beams with voltages typically less than 10 keV at power densities (flux) ranging from a few 10's of kW/cm$^2$ to several 10's of MW/cm$^2$. Furthermore, the electron beam energy must be deposited in the material in a time short enough to preclude significant thermal diffusion into the material underlying the surface region. This requires energy densities (fluence) on the order of a few to several hundred joules/cm$^2$.

Such requirements simply cannot be met by either such "Electrocurtain", or "Electropulse" products as described in said patents. The "Electrocurtain" produces divergent dc electron beam of several hundred keV at power densities of a few 10's of W/cm$^2$. Hence, its penetration depth is far too great by a factor of at least 100, and its power density is too low by three to six orders of magnitude to accomplish the results needed by the applications underlying the present invention. As for the "Electropulse" equipment, it uses a field emitting cold cathode which can produce flux levels of several 10's of MW/cm$^2$ at fluence levels that are of interest. However, like the "Electrocurtain", it is designed to operate at several hundred keV and, due to the nature of the cold cathode, inherently lacks the uniformity required for the new applications. Futhermore, in order to process large areas, it must be repetitively pulsed at a rate which would severly reduce cathode life.

Though prior experience thus initially contraindicated the practicality of a strip type beam of the then known types for the purposes herein, it was later found that, through rather radical changes in concept of beam formation (including converging instead of expanding or diverging acceleration of a linear beam), novel flux, fluence, voltage and operating power requirements and cathode-target dimensions, a highly successful approach was feasible for producing a unique strip electron beam.

An object of the present invention, accordingly, is to provide a new and improved process and apparatus for the electron-beam treatment of objects and materials, including but not limited to semiconductor surfaces and the like, that does not have the above-described and other limitations of earlier photon or electron-beam processes and that, to the contrary, provides vastly improved physical, chemical and/or mechanical surface (and sometimes volume) modifications, and in a controlled and predetermined manner.

A further object is to provide a novel converging, this electron beam strip, and process and apparatus for forming and controlling the same, for the above purposes and for more general use, as well.

Still a further object is to provide a novel technique and equipment for effecting surface modification, including annealing, welding, etching, polishing, curing, cutting and inducing physical, chemical, mechanical and related material changes.

Other and further objects will be explained hereinafter and are more particularly delineated in the appended claims. In summary, however, from one of its important aspects, the invention embraces a process for treatment of objects with the aid of electron beam energy, that comprises, generating and propagating electrons within a vacumm along a predetermined direction and in a linear beam that extends transverse to said direction; converging the beam into a fine line of intense charge; and impacting the converged fine line beam upon an object-to-be-treated. In accordance with the invention, this process can usefully be performed with the converged beam exited outside the vacumm and there-impacted upon the object as well as accomplishing same inside the vacumm. Preferred details and best mode embodiments are hereinafter presented.

The invention will now be described with reference to the accompanying drawing.

FIG. 1 of which is a graph illustrating the temperature effect of a thin converged electron beam strip of the invention upon a material strip moved thereunder;

Before describing practical equipment for the practice of the process of the invention, or delving into particular process applications and results presently attained, it is believed fundamental to an understanding of the invention to discuss underlying considerations of transient surface heating by the strip electron beam and, accordingly, generation and focusing concepts employed in connection therewith.

Figure 1:
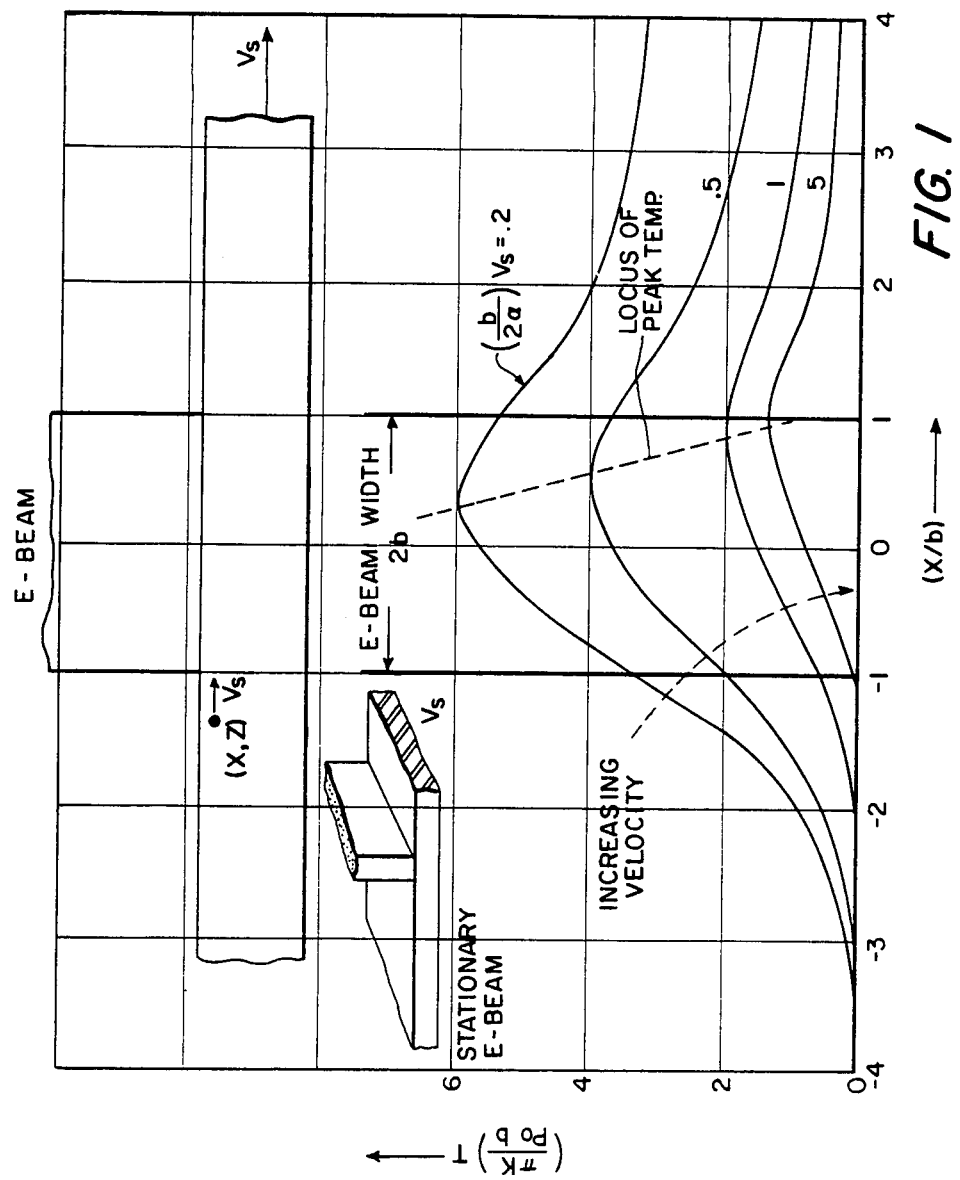

Considerations discussed thus far suggest that a strip electron beam of high aspect ratio is well suited for the applications herein. For surface heating applications, this electron beam is characterized by voltages on the order of a few keV, flux levels of 10's of Mw/cm$^2$ and target current densities of 100's of A/cm$^2$. The long dimension of the electron beam, transverse to its direction of propagation as before stated, should be comparable to the width of the treated target area, which, in practice, is easily achievable by using a thermionic cathode with a length slightly greater than this dimension. To appreciate those factors determining the narrow dimension of the strip electron beam, the transient heating of an object in relative movement with regard to the strip beam must be considered. This situation is illustrated in FIG. 1 where the normalized temperature $[(\pi K/P_0 b)T]$ at a point on the surface of a semi-infinite material slab is plotted as a function of position (x/b) for several values of normalized target velocity $(b/2\alpha) V_s$, where $\alpha$ is the thermal diffusivity of the material heated by a strip beam of width 2b. At low velocity, the temperature distribution is nearly symmetrical owing to thermal diffusion in both the positive and the negative x-direction (left and right of 0 on the abscissa). As the target velocity increases, becoming comparable to the effective thermal diffusion velocity, the maximum temperature occurs near the trailing edge of the strip electron beam and is reduced in value due to the point of interest being under the beam for a shorter time.

It is evident from FIG. 1 that the effective thermal diffusion velocity for any material is approximately $20\alpha/2b$; and that for velocities greater than this velocity, the temperature of a fixed point on the target surface does not change appreciably until it reaches the leading edge of the electron beam and the maximum temperature is proportional to the time under the beam.

Figure 2:
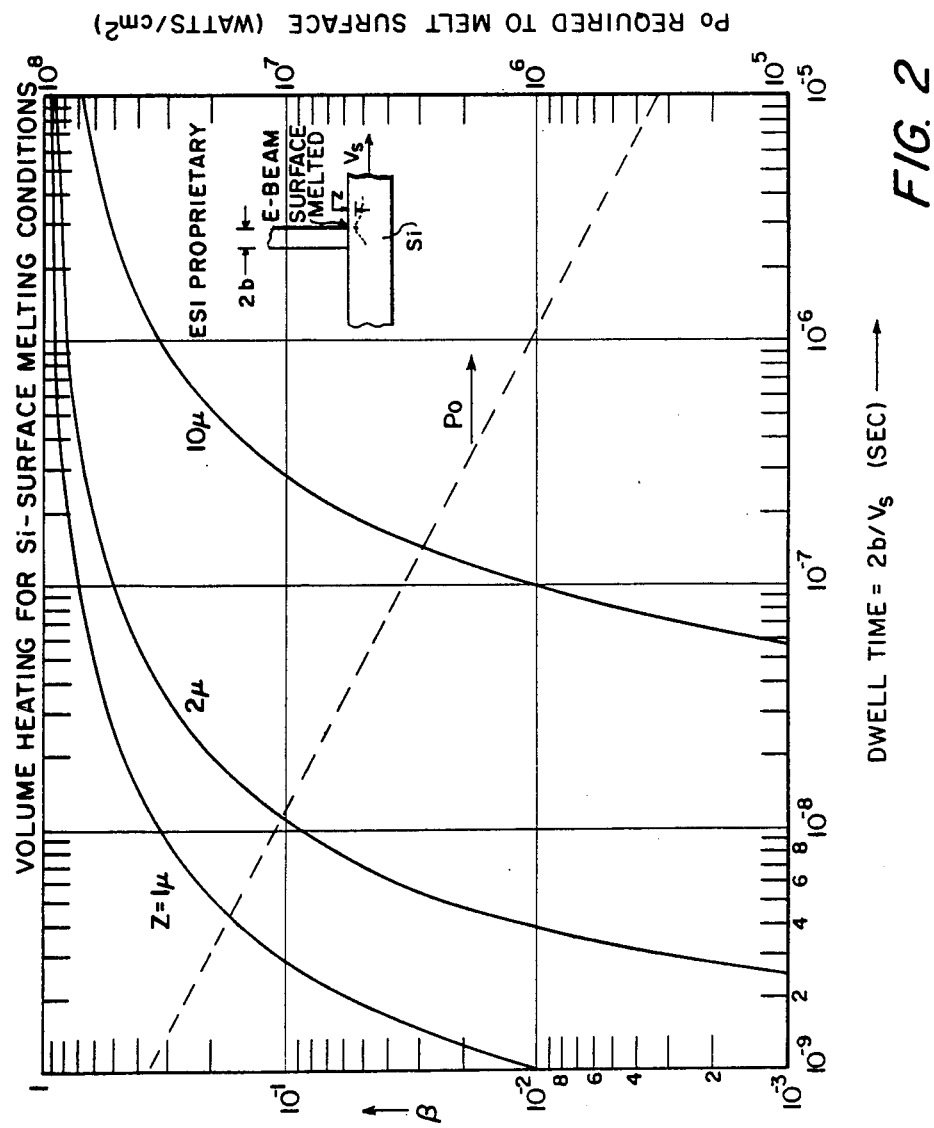
FIG. 2 is a graph showing the volume heating and dwell time requirements for an illustrative silicon semiconductor surface treatable in accordance with the invention.

The resulting temporal and spatial temperature distribution for this condition is shown in FIG. 2 for points z=1, 2 and 10 microns below the surface of a semi-infinite slab of silicon moving at velocity $V_s$ under a stationary strip electron beam. The temperature at any depth z is normalized with respect to the surface temperature at z=0 so that the left-hand ordinate value $\beta$ of unity, corresponds to any desired surface temperature up to and including the melting temperature of silicon. The dwell time, $2b/V_s$, plotted along the abscissa, is the time under the beam of the point for which the temperature is to be determined. The right-hand ordinate scale plots the power Po required to melt the surface, in units of watts/cm$^2$.

Solid phase recrystallization applications, for example, can require silicon surface temperatures to be in the range of 900° to 1000° C., which is well below the melting temperature of 1410° C. It also can be important, however, not to raise the temperature in a region say 10 microns below the surface to the more than 500° C. According to the data of FIG. 2, the dwell time corresponding to these requirements is approximately 2 microseconds. By comparison, for a critical heating depth of 2 microns, the required dwell time would be 100 nanoseconds. In this manner, the ratio of electron beam width 2b to target velocity Vs is determined for each individual application.

The velocity of the material may well be determined by the recrystallization propagation velocity which is presently thought to be in the range of 100 to 300 cm/sec. This suggests electron beam widths on the order of a few microns for this particular application.

Relative motion between the target and the strip electron beam also can be accomplished by scanning the electron beam and is further claimed for this invention.

Other applications which allow operation at higher target velocities or more gradual temperature gradients, require electron beam widths of 10's to 100's of microns.

To insure spatial and temporal uniformity of the electron beam current density, a dispenser thermionic cathode operating in the space charge limited regime is a preferred electron source for such uses of the invention. Such cathodes are capable of continuous operation at current densities in the range of 1 to 10 A/cm$^2$ for $10^4$ to $10^3$ hours, respectively. A typical dispenser cathode compound of 3 moles of low work function BaO, 1 mole of CaO, and 1 mole of Al$_2$O$_3$, may be impregnated in a porous tungsten substrate, and the cathode may be dimensioned with ratios as before discussed.

Figure 3:
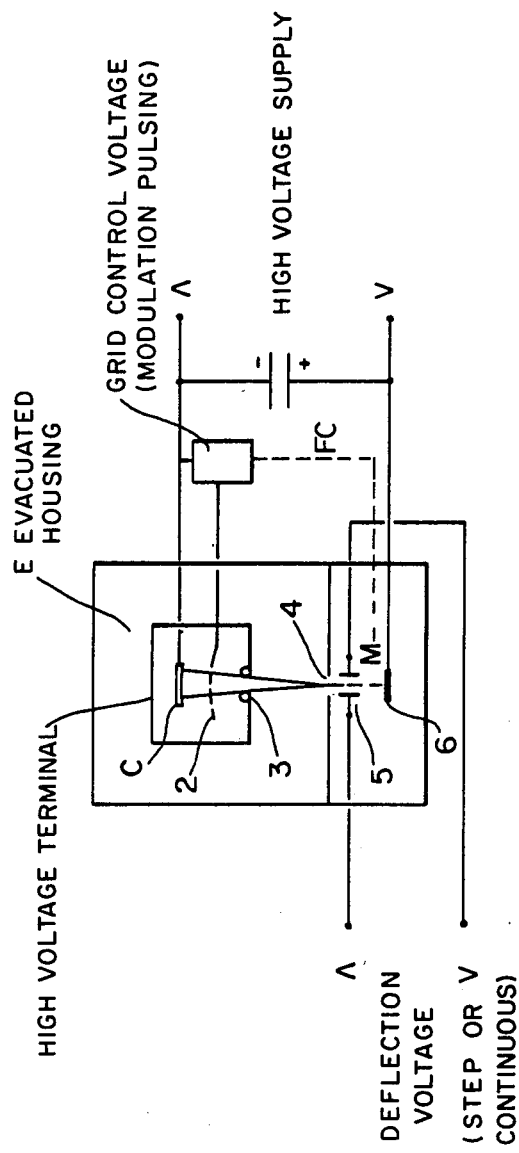
FIG. 3 is a schematic circuit diagram of an apparatus for generating the strip beam of the invention (shown end-on)

Referring to FIG. 3, the linear cathode C is shown end-on, schematically, disposed in an evacuated housing or envelope E. Although inherently characterized by uniform emission, operation of the dispenser cathode C in the space charge-limited mode insures spatial uniformity of the emitted current density. Asperities on the emitting cathode surface with dimensions as large as 178 ×1 cm have been completely eliminated within 1 cm of the cathode surface by space charge-limited operation. Such a dispenser cathode can be manufactured in continuous lengths, say, of up to 17 cm, which is large enough to process a 15 cm diameter wafer, as before discussed. The surface is easily machined so that the narrow cathode dimension can be made consistent with both the current density required to process the target and the intervening electron beam optics. Typically, this dimension is on the order of 0.5 cm for the beam compression range envisioned.

In sharp contrast to electron beams of circular cross section, the strip electron beam may, in principle, be compressed to a vanishingly small intense line focus as later described. Totally unlike the prior-art strip or "curtain" electron beams, before discussed, very narrow or thin electron beams with widths of only a few microns are required for some of the applications of the invention. Attempting to accomplish this goal with low energy, high-current density electron beams, suggest that space charge-induced beam blow-up might be a major constraint if not an insurmountable problem. Even though this is indeed the case with spot electron beams, it is not true of strip electron beams produced in the manner before described.

In addition to the space-charge blow-up constraint suffered by spot electron beams there also is a size constraint. Since many of the applications mentioned required the smaller electron beam dimension to be on the order of a few microns, a psuedo-like electron beam generated by rapidly scanning a spot electron beam generated by a circular cathode, would require the cathode diameter to be on the order of 4 times that of the electron beam spot at the target. Such a cathode constitutes a point source and is not amenable to producing an expanded electron beam for those applications requiring considerably larger electron beam width.

The strip electron beam produced by the system of FIG. 3, however, is not limited by any of these constraints. Space charge blow-up is not a problem for strip electron beams of high aspect ratio, because the space charge-produced transverse potential well decreases as the strip electron beam is compressed, going to zero in the limit of infinite-beam compression. In the case of the spot electron beam, the ratio of the potential well, to the accelerating potential, is a constant. However, this ratio for the strip electron beam is reduced by the concentration factor of the electron beam. It also should be noted that at any concentration greater than or equal to unity, the strip potential well is less than that of the spot electron beam. Thus, it is possible to concentrate electrons uniformly emitted from a strip cathode into a very fine line strip at the target plane. It is this intrinsic advantage of the strip electron beam of the invention that, above all of its other advantages, renders it so successful for the purposes herein.

Returning, now, to the construction of FIG. 3, the cathode C can be directly heated, electron bombardment heated, or indirectly heated. An extraction grid 2 is spaced a few millimeters from the cathode, with a perveance such that the required current density can be obtained with a few kilovolts or less of extraction pulse. The converging optics, as distinguishing from the expanding acceleration of prior linear beams before mentioned, injects a narrow strip electron beam at aperture 3 in the main electrostatic accelerating gap, the geometry of 3 being such that the electric field further focuses the strip laterally during the initial stages of acceleration in the main gap. In general, the electron beam with linear or transverse strip cross-section passes in the longitudinal direction through ground aperture 4 to impact upon the treatment or workpiece object area 6.

In cases where scanning is required, the aperture 4 is followed by a deflection system, shown as electrostatic plates 5, which deflects or scans the beam at right angles to the transverse strip length, either in steps or continuously. With 2 cm long deflection plates spaced 1 cm, a deflection voltage of 1 kV is sufficient to displace the electron beam by 2.5 cm at a projection distance of 12 cm. It is, of course, also possible to use magnetic deflection. The intensity of the electron beam is controlled by grid 2, as in the manner of a triode, and thus the beam can be modulated in intensity, as desired, such as pulsed on and off at controlled intensities by voltage modulation of the grid 2 with respect to the cathode C.

At high current or charge density, space charge becomes a significant factor by producing an expansion in the beam which roughly is proportional to current density and varies inversely with the $V^{3/4}$, where V is the accelerating voltage. As an example, at 5 A/cm$^2$ at 20 keV, the beam expands roughly by a factor of five over a drift length of 12 cm. However, in practice, even in good vacuum conditions, the effect is less than calculated because of charge compensation by positive ions from the residual gas atoms; and significant reductions in the effect can be achieved by deliberately introducing an inert gas such as argon which will not effect cathode performance to provide ion focus. As an illustration, in practice, argon gas has been introduced to the system in order to cause the strip electron beam to focus at the focal plane some 20 cm from the cathode. Using this technique, it is possible routinely to focus a 2-3 cm long beam to a narrow strip with a width of approximately 0.1 cm. By direct visual observation, it was noted that at certain ion densities, targets of silicon and titanium exploded, producing shrapnel of incandescent metal. It is estimated that line widths of considerably less than 1000 microns were produced which caused such an explosion at a flux density on the order of 100 kW/cm$^2$. These observations demonstrate that the narrow strip electron beam required by many of the applications herein can be enabled by using ion focusing and/or the electrostatic focusing techniques before described. The presence of ions also aids in the neutralization of electron space-charge build-up on the surface of dielectrics that may be present in many of the applications of interest, such as oxide coatings on semiconductors. This is viewed to be extremely valuable.

As already noted, the location of the fine line or strip can be moved by beam deflection; and as before discussed, the material can also be moved in steps, or continuously, through the stationary beam, to treat an extended area. The highest current densities can be obtained in this way since the material can be placed directly at the end of the acceleration zone; i.e. there is no extended path through deflection plates which would increase beam expansion due to space charge effects.

For example, experimental data from a small prototype with a 2 cm wide by 3 cm long strip cathode shows focusing of a 5 A and 7 keV beam to a strip about 1.5 mm wide by 2 cm long at the target. This corresponds to a current density in the range of 10-15 A/cm$^2$.

Figure 4:
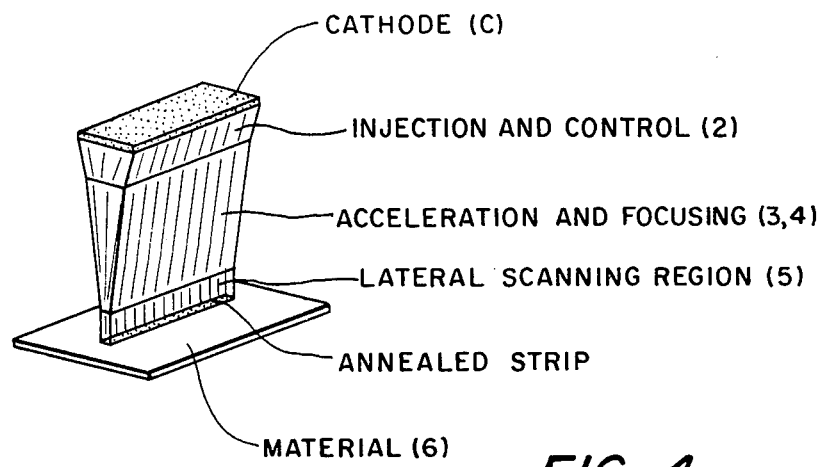
FIG. 4 is an isometric illustrative view of the strip beam produced in the apparatus of FIG. 3.
Figure 5:
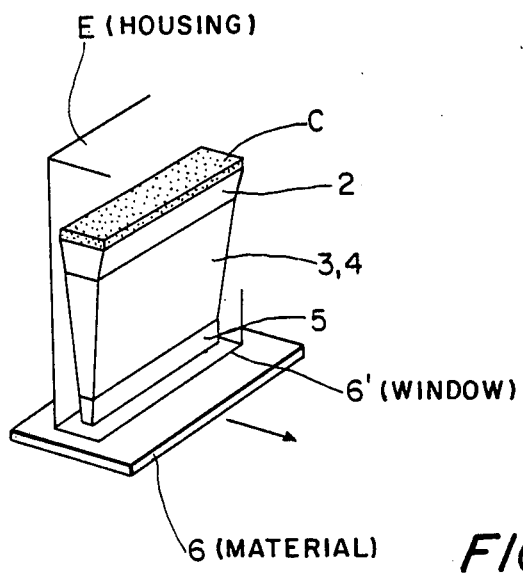
FIG. 5 is a view similar to FIG. 4 of a modification using a low-voltage electron beam permeable window for external material treatment.

While FIG. 3 is a schematic circuit diagram, it only shows the converging, end-on. The isometric schematic view of FIG. 4 shows the strip nature. FIG. 5 is like FIG. 4 illustrating the situation where instead of a workpiece 6 within the vacuum envelope E, an electron-pervious window 6' is provided for exiting the converged thin strip beam through the window to impact upon the material or object external thereto. For example, very thin foils of berylium are available commercially in thicknesses down to 100 micrograms/cm² which are practical for electron windows even at 10 keV energies (2-3 keV energy loss).

A typical, though not exclusive, set of operational characteristics may be as follows:

| PARAMETRIC OPERATING RANGE OF THE STRIP ELECTRON BEAM SYSTEM | |
|---|---|
| Beam Dimensions | |
| Length | 2-15 cm |
| Width | $10^{-3}$-1 cm |
| Beam Voltage | |
| Lower Limit | 1-5 kV |
| Upper Limit | 10-30 kV |
| Beam Current Density | 1-1000 A/cm² |
| Material Treatment Time | 5 μs-cw |
| Material Velocity | 0-1000 cm/sec. |
| Material Preheat Temperature | 20-500° C. |

A comparison of spot and strip energy beam performance is presented in the following table for conditions required to process a 6-inch diameter silicon wafer with 50 micron diameter spot energy beams and a 50 micron by 15 cm. strip electron beam of the invention. The significant factors in this comparison include the superior process speed, efficiency, throughput, and uniformity achievable with the strip electron beam.

Among semiconductor processing uses of interest, available for LSI, VLSI, SOS, and solar cell fabrication, and for developing advanced vertical semiconductor architecture fabrication concepts, are annealing, formation of metal-silicide interconnectors, formation of P-doped SiO₂ layers, formation of homogeneous substrates, surface diffusion of selected species, zone defining, impurity gettering, and solid-or liquid-phase regrowth of large single crystals by epitaxial, heteroepitaxial, or graphoepitaxial recrystallization.

More general materials modification applications include alloying, hardening, chemistry, melting, sintering, polishing, metallurgy, material removal, cutting and slitting and welding.

In connection with the semiconductor area, it is in order to illustrate specifically some of these useful requirements attainable with the invention; namely, annealing, recrystallization, formation of metal-silicide interconnectors and vertical architecture fabrication.

Turning first to annealing, one of the significant breakthroughs in semiconductor fabrication was the discovery that a number of dopant species would be spatially distributed in a prescribed region by accelerating dopant ions to high potential energies and subsequently causing these ions to impinge upon the semiconductor target. Reaching the target surface with a kinetic energy of several 10's to several 100's of keV, the dopant atoms bury themselves at the desired junction depth

| COMPARISON OF SPOT AND STRIP ENERGY BEAMS | | | |
|---|---|---|---|
| Characteristic Parameters Required to Process a 6 Inch Diameter Silicon Wafer | Scanned Laser | Scanned Spot Electron Beam | Stationary Strip Electron Beam |
| (P/r) required | 1.7 × 10³ watts/cm | 1.7 × 10³ watts/cm | — |
| (P/A) required | 250 kW/cm² | 250 kW/cm² | 60 kW/cm² |
| Beam dimension | ≅50μ dia | ≅50μ dia | 15 cm × 50μ |
| Absorbed beam power | 5 watts | 5 watts | 4500 watts |
| Process rate at 100 cm/sec | .5 cm²/sec | .5 cm²/sec | 1200 cm²/sec |
| Process time | 8 minutes | 8 minutes | 150 milliseconds |
| Energy absorbed | 2400 joules | 2400 joules | 675 joules |
| Source energy required | 6000 joules | 2400 joules | 675 joules |
| Wall plug power required (exclusive of auxillary pwr) | 12.5 kW, ave - 1 hr | 7 watts, ave - 1 hr | 80 watts ave |
| Throughput | 7 wafers/hr | 7 wafers/hr | 600 wafers/hr |
| Spatial uniformity | poor | poor | excellent |

Figure 6A:
FIGS. 6A and B are photomicrographs contrasting an untreated silicon surface with one temperature-treated in controlled fashion in accordance with the invention.
Figure 6B:

An illustration of the efficacy of the process of the invention with semiconductor silicon and controlled melting thereof, is presented in FIGS. 6A and B. In FIG. 6A, the unpolished side of a silicon wafer is shown at a magnification of 500. The irregularities are the unpolished crystal lattices that protrude from this surface. This same surface is shown in FIG. 6B after successive 100 micro-second pulses of the 2 cm×0.1 cm strip electron beam produced as above described. The beam flux was about 250 kw/cm², so that the absorbed fluence per pulse was 25 joules/cm². The adiabatic temperature rise for those conditions is approximately 400° C. per pulse so that several pulses were required to melt silicon under thermal diffusion limited conditions. This was indeed accomplished as indicated in FIG. 6B, demonstrating the efficacy of the invention for such high-temperature treatment in a controlled fashion.

As before stated, the invention is of wide applicability in applications of both surface and volume heating, not only in the illustrative application area of semiconductor processing, but more generally in materials surface modification, and in other treatment techiques.

of some several hundred to several thousand angstroms beneath the target surface. This process is called ion implantation and is now a very much relied upon semiconductor fabrication technique. A problem associated with ion implantation, however, is the damage caused by the dopant atoms as they are decelerated by the target crystal lattice. At high dopant concentration levels, the surface of the implanted target can be rendered completely amorphous. In order to restore the crystallinity of the ion-damaged surface and to insure acceptable substitutionality and activation, the semiconductor must be in an annealing furnace for up to an hour at temperatures on the order of 1000° C. At these high temperatures, significant dopant diffusion can occur which offsets the initial advantage of implanting dopant ions in a prescribed spatial distribution.

Another disadvantage of high-temperature oven annealing is that it can be used only for semiconductors that have not been previously processed with materials that would be adversely effected at the temperatures required for annealing.

The present invention is admirably suited for successful annealing by rapidly heating only the implanted surface layer to annealing temperatures without substantially raising the temperature of the bulk material just below the implanted region.

The invention also shows significant promise in the recrystallization of amorphous or small grain silicon on inexpensive substrates as for solar cell and related uses. In this process, small grain silicon is deposited on the substrate by any of a number of conventional techniques, such as chemical vapor deposition. Since grain boundaries impede the movement of charge carriers and can provide leakage paths across junctions due to enhanced impurity diffusion, it is desirable to produce as large a grain size as possible in order to minimize these deleterious effects. This can be done by heating the small grain silicon to temperatures that induce the formation of large crystals by a number of mechanisms such as solid phase or liquid phase regrowth by epitaxial, heteroepitaxial, or graphoepitaxial recrystallization. This application can require either surface heating or volume heating depending upon the applicable recrystallization physics and the thermal properties of the underlying substrate. It is commercially attractive because inexpensive materials and fabrication techniques result in very valuable, large grain silicon crystals required for efficient solar conversion.

Another aspect of the controlled temperature treating techniques of the invention, is to accomplish the above goal using GaAs instead of Si. The primary purpose for doing this is that the solar conversion efficiency of GaAs can be as high as 25% compared to 10–15% for silicon. Furthermore, solar absorption of GaAs is approximately three times greater than Si so that the GaAs layer thickness needs to be only a third that of silicon. This property is exploited in order better to utilize GaAs which is not nearly as plentiful as silicon and, hence, more expensive.

The rc-time constant of the interconnectors between active sites is a factor presently constraining the rate at which information can be processed by computer chips. The reason for this is that after fabricating and processing the active sites in a suitable substrate material, a thin oxide coating is produced to insure site-to-site insulation. The interconnections between these sites is fabricated over this thin dielectric layer. The resulting distributed-rc network produced by this configuration reduces the effective process speed of the computer chips. Presently a factor-of-two reduction in resistance is considered to be significant, with factors of three having been achieved on a small scale using spot laser beams. The present invention shows promise in such controlled formation of metal-silicide and related interconnections.

An adjunct to the preceding application is that of vertically stacking prefabricated substrates which greatly increases computer packing density. To accomplish this, a suitable dielectric layer such as phosphor-doped $SiO_2$ must be heated and caused to flow across the top of each layer to provide adequate interlayer insulation. This must be done without significant heating of the underlying fully processed layers and, therefore, requires the processing of the invention with a very well controlled surface heating capability.

The scan voltage applied to the deflecting means 5, FIG. 3, as before discussed, may be used to effect stepped scanning by the fine line beam of the object or material, or continuous scan, or a scan that, if desired, is modulated to effect predetermined profiling effects on the material. Relative movement of workpiece material and thin strip beam can also effect desired scan results. Thus the scan of the object may be effected by traversing the beam over the object, or moving the object past the beam, or by a combination of the same.

The rate of scan may be varied at 5 during the traverse by the object, as well. Similarly the pulsing or other intensity-modulation of the beam effected at 2 (not excluding continuous operation where desired), can produce profiling or other predetermined pattern treatment, with and without masking predetermined portions of the workpiece object or material, as desired. Since, moreover, the heat may travel faster in the material than some of the processing speeds, a higher substrate temperature may result at one edge that can be thusly compensated for through such modulation. Similar remarks apply to controlling the removal, thermal polishing or machining of predetermined amounts of material (again, with or without masking), and to the provision of substantially burn-less cutting or slitting, including deep-aspect cutting or drilling. Application of the technique to etching or cleaning, as in the case of crystalline and other materials, has been mentioned. The invention is also most suitable for the activation of materials, such as photo resistive and other surfaces, as by curing effects, or concentrated well-defined and controlled thermal shock and resulting effects, including generated acoustic wavefronts of large pressure. Because of the scan-control aspect, curing or other concentrated effects need not be restricted to the straight line of the thin strip beam, but may be directed along lines of changing direction including along curved lines, as well; and, as before stated, the linear cathode may itself be shaped, as in curvalinear manner.

The process of the invention, moreover, also lends itself to monitoring of the degree of treatment of the object, and effecting modulation or scanning control variation in response to the monitoring to achieve the desired result. This is illustratively shown schematically in dotted lines in FIG. 3 in connection with thickness sensing at M of the object under treatment at 6, and feedback control FC to the grid control voltage to reduce or increase the beam intensity in accordance with the monitored condition. Clearly other parameters may be monitored with appropriate feedback controls for trimming as is well known.

Further modifications will also occur to those skilled in this art and such are considered to fall within the spirit and scope of the invention as defined in the appended claims.

What is claimed is:

1. A process for heat treatment of a solid object of solid material having a major surface by means of electron beam energy, that comprises:
generating and propagating electrons within a vacuum along a predetermined direction and in a linear beam that extends transverse to said direction;
converging the beam into a fine line of intense charge;
impacting the converged fine line beam upon said major surface of the object being treated;
relatively moving said beam and object so that said beam relatively scans said major surface in a direction at right angles to said fine line; and
regulating the kinetic energy of said beam to limit the depth of penetration of said object by said electrons and the power density (flux) of said beam and the velocity with which the latter relatively scans said major surface such that a layer of said object at said major surface with a maximum depth of the order of several microns has its temperature raised sufficiently to effect said heat treatment of said layer while thermal diffusion to the solid material underlying said layer is substantially precluded by limiting the time that any given location on said major surface is impacted by said beam.

2. A process as claimed in claim 1 and in which the said object is disposed in said vacuum.

3. A process as claimed in claim 1 and in which the converged beam is exited outside the vacuum and there impacted upon said object.

4. A process as claimed in claim 1 and in which said linear beam extends along substantially a straight line.

5. A process as claimed in claim 1 and in which said linear beam extends along lines of changing direction including curvalinear lines.

6. A process as claimed in claim 1 and in which the beam is adjusted to be of transverse length of from about 2 to 15 cm. or longer and converged to a width of the order of between substantially $10^{-3}$ and 1 cm., or wider and the beam profile is adjusted to produce beam current densities of the order of up to about 1000 A/cm$^2$ under beam voltages with limits from about 1 to 30 Kv.

7. A process as claimed in claim 1 and in which the kinetic energy and flux of said beam and the energy density (fluence) absorbed by said object from said impacting beam are adjusted to effect at least one of annealing, welding, etching, curing, cutting, polishing and surface alteration.

8. A process as claimed in claim 1 and in which the beam is modulated in intensity during the scan.

9. A process as claimed in claim 8 and in which the beam is pulsed.

10. A process as claimed in claim 1 and in which the further step is performed of masking predetermined portions of the object from the beam during the scan.

11. A process as claimed in claim 1 and in which the effective rate of scan is varied during transverse of the object.

12. A process as claimed in claim 1 and in which the progress of the electron beam treatment of the object is monitored at the object and the treatment of the same is controlled in accordance with said monitoring.

13. A process as claimed in claim 1 and in which the length of the strip is adjusted substantially to correspond to a dimension of the object under treatment.

14. A process as claimed in claim 6 and in which the treatment time of the fine line beam upon any point of the object is of the order of microseconds.

15. A process as claimed in claim 1 and in which the beam is stationary and the object is moved past the fine line beam at velocities up to the order of about 1000 cm./sec.

16. A process as claimed in claim 1 and in which said converging is effected by at least one of electrostatic and ion focusing.

17. A process as claimed in claim 1 and in which the electron beam has a kinetic energy of the order of a few keV and less at power densities ranging from a few 10's of KW/cm$^2$ to several 10's of MW/cm$^2$.

18. A process as claimed in claim 1 and in which the power density of the beam and the velocity with which the later relatively scans said major surface are regulated to deposit energy in said object at energy densities (fluence) of the order of from a few Joules/cm$^2$ to several hundred Joules/cm$^2$.

19. A process as claimed in claim 1 and in which the object is of semiconductor material and the said treatment by the fine line electron beam effects one of annealing, formation of metal-silicide interconnectors, formation of doped SiO$_2$ layers, formation of homogeneous substrates, surface diffusion, zone refining, impurity gettering, and solid-or-liquid-phase regrowth of large single crystals by one of epitaxial, heteroepitaxial, and graphrepitaxial recrystallization.

20. Apparatus for generating a fine line strip electron beam for the heat treatment of a solid object of solid material having a major surface for physical, chemical, mechanical and other modifications at said major surface, comprising, in combination:

electron gun means for propagating electrons along a predetermined direction and disposed within an evacuated housing and including a cathode for generating the electrns extending linearly transversely to said direction, control grid and acceleration and focusing means, and means for adjusting the latter to converge the linear beam into a fine line electron beam strip;

means for supporting the object-to-be treated with said major surface thereof in the path of the converged fine line beam strip; the cathode being of a length corresponding substantially to a dimension of said major surface so that the same is treated by the fine line beam simultaneously across such dimension;

means for relatively moving said beam and object so that said fine line beam strip relatively scans said major surface at a predetermined velocity and in a direction at right angles to said dimension; and means for regulating the kinetic energy of said beam to limit the depth of penetration of said object by said electrons and the power density (flux) of said beam and the velocity with which the latter relatively scans said major surface such that a layer of said object at said major surface with a maximum depth of the order of several microns has its temperature raised sufficiently to effect said heat treatment of said layer while thermal diffusion to the solid material of said object underlying said layer is substantially precluded by limiting the time that any given location on said major surface is impacted by said beam.

21. Apparatus as claimed in claim 20 and in which the material supporting means is disposed within said housing.

22. Apparatus as claimed in claim 20 and in which the beam voltage is of the order of a few 10's of kV at power densities ranging from a few 10's of KW/cm$^2$ to several 10's of MW/cm$^2$.

23. Apparatus as claimed in claim 20 and in which the fine line beam strip is adjusted to be of transverse length of from about 2 to 15 cm. or longer and is converged to a width of the order of between substantially $10^{-3}$ cm. and a few centimeters.

24. Apparatus as claimed in claim 23 and in which the current densities of said beam strip are adjusted to be of the order of up to about 1000 A/cm$^2$ under beam voltages within limits from about 1 to 30 Kv.

25. Apparatus as claimed in claim 20 and in which the accelerating means and means for relatively moving are adjusted to provide energy densities (fluence) in the object of the order of from a few Joules/cm² to several hundred Joules/cm².

26. Apparatus as claimed in claim 20 and in which the material is a semiconductor and the said treatment by the fine line electron beam effects one of annealing, formation of metal-silicide interconnectors, formation of doped $SiO_2$ layers, formation of homogeneous substrates, surface diffusion, zone refining, impurity gettering, and solid-or-liquid-phase regrowth of large single crystals by one of expitaxial, heteroepitaxial, and graphrepitaxial recrystallization.

27. Apparatus as claimed in claim 20 and in which there is provided, interposed between the focusing and material supporting means, electron beam deflection means for enabling deflection of the fine line strip, as for stepped and other position-changing scanning.

28. Apparatus as claimed in claim 20 and in which means is provided for moving the material past the fine line strip.

29. Apparatus as claimed in claim 28 and in which deflecting means is provided for supplementing the scanning effected by material moving, by electron scanning of the strip.

30. Apparatus as claimed in claim 29 and in which means is provided for intensity-modulating the fine line strip beam, including pulsing the same.

31. A process for heat treatment of a solid object of solid material having a major surface by means of electron beam energy, that comprises:
generating and propagating electrons within a vacuum along a predetermined direction and in a linear beam that extends transverse to said direction;
converging the beam into a fine line of intense charge;
impacting the converged fine line beam upon a region of said major surface of the object being treated; and
regulating the kinetic energy of said beam to limit the depth of penetration of said object by said electrons and the power density (flux) of said beam and the time for which the latter impacts said region of said major surface such that a layer of said object in said region with maximum depth of the order of several microns has its temperature raised sufficiently to effect said heat treatment of said layer while thermal diffusion to the solid material underlying said layer is substantially precluded.

32. A process as claimed in claim 31; in which said solid material is a semi-conductor having a small grain size, and said heat treatment causes melting of said layer for epitaxial recrystallization thereof to form a semiconductor having a large grain size.

33. Apparatus for generating as fine line strip electron beam for the heat treatment of a solid object of solid material having a major surface for physical, chemical, mechanical and other modifications at said major surface, comprising, in combination:
electron gun means for propagating electrons along a predetermined direction and disposed within an evacuated housing and including a cathode for generating the electrons extending linearly transversely to said direction, control grid and acceleration and focusing means, and means for adjusting the latter to converge the linear beam into a fine line electron beam strip;
means for supporting the object-to-be treated with said major surface thereof in the path of the converged fine line beam strip; the cathode being of a length corresponding substantially to a dimension of a region of said major surface so that the same is impacted and treated by the fine line beam simultaneously across such dimension; and
means for regulating the kinetic energy of said beam to limit the depth of penetration of said object by said electrons and the power density (flux) of said beam and the time for which the latter impacts said region of said major surface such that a layer of said object in said region with a maximum depth of the order of several microns has its temperature raised sufficiently to effect said heat treatment of said layer while thermal diffusion to the solid material of said object underlying said layer is substantially precluded.

34. Apparatus as claimed in claim 33; in which said solid material is a semi-conductor having a small grain size, and said heat treatment causes melting of said layer for epitaxial recrystallization thereof to form a semiconductor having a large grain size.

* * * * *